United States Patent
Chow

(10) Patent No.: US 6,359,478 B1
(45) Date of Patent: Mar. 19, 2002

(54) REDUCED-UNDERSHOOT CMOS OUTPUT BUFFER WITH DELAYED VOL-DRIVER TRANSISTOR

(75) Inventor: Arnold Chow, Sunnyvale, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/682,437

(22) Filed: Aug. 31, 2001

(51) Int. Cl.$^7$ ................................................ H03K 3/00
(52) U.S. Cl. ........................................ 327/112; 327/391
(58) Field of Search ................................. 327/108, 111, 327/112, 379, 389, 391, 170; 326/26, 27, 85, 87, 83, 86

(56) References Cited

U.S. PATENT DOCUMENTS

| | | | | |
|---|---|---|---|---|
| 5,015,880 A | * | 5/1991 | Drake et al. .................. | 326/87 |
| 5,036,222 A | | 7/1991 | Davis .......................... | 307/443 |
| 5,036,232 A | | 7/1991 | Jungert et al. .............. | 307/542 |
| 5,055,714 A | | 10/1991 | Obregon ..................... | 307/443 |
| 5,166,555 A | * | 11/1992 | Kano ........................... | 326/87 |
| 5,438,277 A | | 8/1995 | Sharpe-Geisler ............ | 326/27 |
| 5,559,447 A | * | 9/1996 | Rees ............................ | 326/87 |
| 5,717,343 A | | 2/1998 | Kwong ........................ | 326/27 |
| 5,838,177 A | | 11/1998 | Keeth .......................... | 327/108 |
| 5,894,238 A | | 4/1999 | Chien .......................... | 327/112 |
| 5,912,577 A | * | 6/1999 | Takagi ......................... | 327/112 |
| 5,977,790 A | | 11/1999 | Sanwo et al. ................ | 326/27 |
| 6,014,046 A | | 1/2000 | Douse et al. ................ | 327/112 |
| 6,091,260 A | | 7/2000 | Shamarao .................... | 326/27 |
| 6,184,730 B1 | | 2/2001 | Kwong et al. .............. | 327/112 |
| 6,242,942 B1 | | 6/2001 | Shamarao .................... | 326/27 |
| 6,255,867 B1 | | 7/2001 | Chen .......................... | 327/108 |
| 6,320,432 B1 | * | 11/2001 | Nagao ......................... | 327/108 |

* cited by examiner

*Primary Examiner*—Toan Tran
(74) *Attorney, Agent, or Firm*—Stuart T. Auvinen

(57) ABSTRACT

A large pull-down voltage-output-low VOL transistor is placed in parallel with a smaller pull-down switching transistor. The smaller switching pull-down transistor is turned on during switching. Once switching has nearly completed, the larger pull-down VOL transistor is turned on to provide a current sink for maintaining a VOL close to ground. Switching current is limited by the smaller switching pull-down transistor, while a large static sink current is provided by the VOL transistor to meet VOL requirements. The gate of the VOL transistor is controlled by p-channel and n-channel data transistors that are controlled by the data input, and p-channel and n-channel feedback transistors with gates connected to the buffer output. An upper n-channel transistor provides current to an intermediate node at the drain of the p-channel feedback transistor, keeping it near an intermediate voltage.

20 Claims, 3 Drawing Sheets

REDUCED-UNDERSHOOT CMOS OUTPUT BUFFER WITH DELAYED VOL-DRIVER TRANSISTOR

BACKGROUND OF INVENTION

This invention relates to output buffers, and more particularly to reducing undershoot and ground bounce for high-drive CMOS output buffers.

Much development effort has gone into reducing noise created by output buffers that drive signals off of an integrated circuit (IC) substrate. As transistor device sizes, especially gate length, are reduced, larger currents can be switched more quickly.

While fast switching of large currents is useful, it has an unwanted side effect. Sudden changes in current can produce ground-voltage bounce as inductances in IC packages resists changes in current. Such changes in the ground voltage inside an IC package can lead to false triggering of other inputs, or other noise problems.

Despite such ground-bounce problems, high current drivers are still useful for some IC applications. IC output buffers or drivers that drive external buses or signal lines may need to drive a large current to compensate for currents through terminating and other resistances external to the IC chip.

The static current drive of an output buffer is often indirectly specified by a voltage-output-low (VOL) and voltage-output-high (VOH) requirement. Under the VOL test conditions, the output buffer must maintain the output voltage below the specified VOL when a specified amount of current is sunk through the output buffer from an external source, such as a tester machine.

To meet the VOL requirement, the effective resistance of a pull-down transistor in the output buffer can be reduced, thus reducing the voltage drop through the output buffer. The effective resistance can be reduced by using a larger, higher-current-driver transistor as the pulldown. Using such a large transistor has the disadvantage that noise is often increased. When the output buffer switches state, the larger transistor produces a larger switching current, resulting in increased inductive ground bounce. The output voltage can then undershoot ground, producing ringing and oscillation of the output voltage.

Many noise-reduction techniques have been employed. The pull-down transistor can be split into several smaller pull-down transistors that are turned on in a sequence, rather than all at once. The slew rate of the signal activating the pull-down transistor can be carefully controlled or shaped. Feedback techniques can also be used.

While these techniques have been somewhat successful at reducing ground bounce, a high output current to meet the static VOL test is still desirable.

DETAILED DESCRIPTION

The present invention relates to an improvement in output buffers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a large pull-down transistor can be placed in parallel with a smaller pull-down transistor. The smaller pull-down transistor is turned on during switching. Once switching has nearly completed, the larger pull-down transistor is turned on to provide a current sink for maintaining a VOL close to ground. Thus switching current is limited by the smaller pull-down transistor, while a large static sink current is provided to meet VOL.

Figure 1:
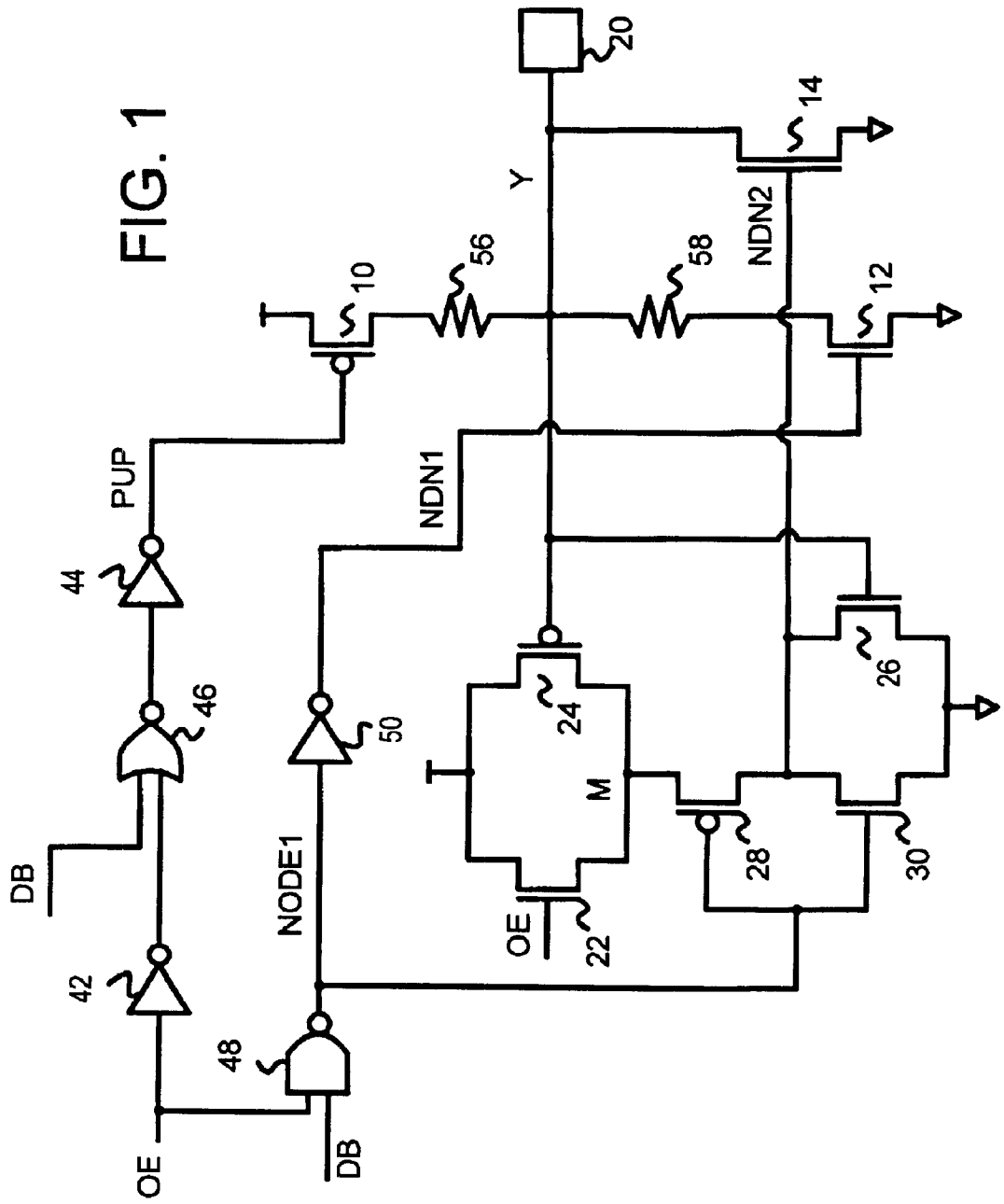
FIG. 1 is a schematic of a low-noise and high-static-current drive output buffer.

FIG. 1 is a schematic of a low-noise and high-static-current drive output buffer. Pull-up p-channel switching transistor 10 drives output Y high through resistor 56. Pull-down n-channel switching transistor 12 pulls output Y low through resistor 58. Resistors 56, 58 act to limit switching current and can be separate resistors or part of transistors 10, 12.

VOL transistor 14 is a large n-channel transistor that can deliver a larger current that n-channel switching transistor 12. VOL transistor 14 is turned on after output Y has switched, or after most of the voltage swing of output Y has occurred. VOL transistor 14 provides a larger current sink to output Y, keeping the output voltage of output Y near ground, and less than the VOL specification, even when a large current is sunk through output Y and VOL transistor 14. This current can be applied by an external tester connected to output Y by pad 20.

Output enable signal OE disables transistors 10, 12, 14 when low, putting the output buffer in a high-impedance state. This allows output Y to be connected to a multi-master bus. When OE is low, inverter 42 drives a high to an input of NOR gate 46, causing inverter 44 to drive signal PUP high. The high PUP signal is applied to the gate of p-channel switching transistor 10, turning it off.

The low OE causes NAND gate 48 to output a high to NODE1, regardless of the state of data-bar signal DB. Inverter 50 then drives a low to node NDN1, which is the gate of n-channel switching transistor 12. Thus transistor 12 is disabled too.

The high signal on NODE1 turns off p-channel transistor 28, but turns on n-channel transistor 30. N-channel transistor 30 then pulls node NDN2 to ground, disabling the gate of VOL transistor 14. Thus transistors 10, 12, 14 are disabled by OE low.

When OE is high, the output buffer is enabled. NOR gate 46 inverts data-bar signal DB, while NAND gate 48 also inverts signal DB. Inverters 44, 50 drive gate nodes PUP, NDN, respectively, with an inverse-data signal.

The high OE signal is applied to the gate of n-channel upper transistor 22, causing node M to be driven high to Vcc-Vtn. Node M receives current through n-channel upper transistor 22 when node M drops below Vcc-Vtn. Thus upper transistor 22 serves to limit the downward swing of node M, keeping node M near Vcc-Vtn. Vtn is the n-channel threshold voltage, adjusted for the body effect since the source of upper transistor 22 is above ground.

The gates of p-channel data transistor 28 and n-channel data transistor 30 are driven by NODE1, which is the true data signal. The gates of p-channel feedback transistor 24 and n-channel feedback transistor 26 are driven by output Y. The gate of VOL transistor 14 is node NDN2, which is driven by the drains of data transistors 28, 30, and the drain of n-channel feedback transistor 26.

Node NDN2 is high, and VOL transistor 14 is enabled, when the NODE1 data signal is low (DB is high) and output Y is also low enough to turn on p-channel feedback transistor 24. Thus VOL transistor 14 is not enabled until output Y has already been switched low by n-channel switching transistor 12.

In operation, when OE is high and DB switches from low to high, output Y will be switched from high to low. NODE1 is driven low, causing node NDN1 to go high. This turns on n-channel switching transistor 12, which starts to pull output Y from high to low. NOR gate 46 and inverter 44 drive node PUP high, turning off p-channel switching transistor 10.

Since output Y is initially high as n-channel switching transistor 12 is turned on, n-channel feedback transistor 26 initially on, keeping node NDN2 low, which is the gate of VOL transistor. Thus VOL transistor 14 remains off.

P-channel feedback transistor 24 is also off when output Y is still high. When NODE1 switches low, n-channel data transistor 30 turns off while p-channel data transistor 28 turns on. Some current can flow through upper transistor 22 and p-channel data transistor 28 to charge node NDN2. However, since n-channel feedback transistor 26 is still on, node NDN2 is kept low.

As n-channel switching transistor 12 pulls output Y low, the lower feedback voltage on the gate of n-channel feedback transistor 26 reduces the current flow through it, increasing its effective resistance. The charging current through upper transistor 22 and p-channel data transistor 28 causes the voltage of node NDN2 to rise somewhat.

As the output Y voltage continues to fall, this lower feedback voltage on the gate of p-channel feedback transistor 24 causes it to eventually turn on. Once p-channel feedback transistor 24 turns on and n-channel feedback transistor 26 turns off, node NDN2 is driven high. The high voltage on node NDN2 is applied to the gate of VOL transistor 14, turning it on. A large current can then be sunk from output pad 20 through VOL transistor 14.

When data signal DB is switched low, the output Y is driven high. Node NDN1 is driven low, turning off n-channel switching transistor 12. Node PUP is also driven low, turning on p-channel switching transistor 10, which pulls output Y from low to high.

The switching of data-bar signal DB low causes node NODE1 to go high. P-channel data transistor 28 turns off, isolating node NDN2 from the power supply. N-channel data transistor 30 turns on, driving node NDN2 to ground. This turns off VOL transistor 14, allowing p-channel switching transistor 10 to drive output Y high without having to fight the large sink current from VOL transistor 14.

Note that the disabling of VOL transistor 14 depends on the data signal to data transistors 28, 30, not the output Y voltage to feedback transistors 24, 26. Thus the output cannot get stuck low by feedback from the large VOL transistor.

Figure 2:
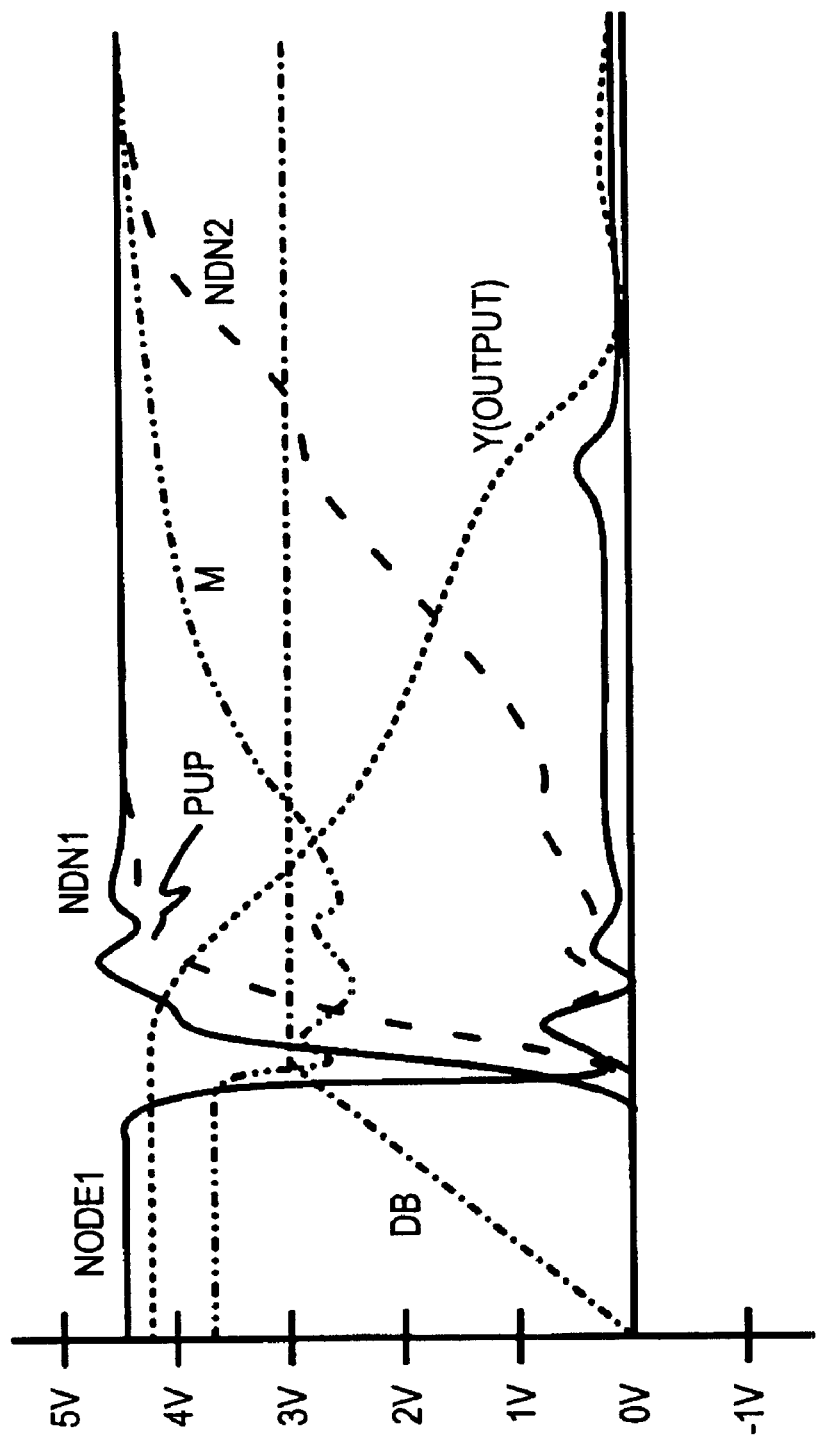
FIG. 2 is a waveform of the output buffer of FIG. 1 driving the output low.

FIG. 2 is a waveform of the output buffer of FIG. 1 driving the output low. A Vcc power-supply voltage of 4.5 volts is used for the simulation. The data-bar signal DB is switched from ground to 3 volts to initiate the low-going transition of output Y.

The gate of the p-channel switching transistor, node PUP, and the gate of the switching n-channel transistor, node NDN1, both are driven high. The pull-down current through the n-channel switching transistor starts to slowly pull output Y low. The pull-down current is limited so output Y drops gradually, reducing noise and ground bounce.

NODE1 switches low, causing the p-channel data transistor to conduct but turning off the n-channel data transistor. The p-channel data transistor conducts current from the upper transistor to node NDN2, causing charge-sharing with node M, which initially falls by about a volt. The n-channel feedback transistor keeps node NDN2 low despite the charge sharing with node M.

As the output Y voltage continues to fall, the current through the n-channel feedback transistor decreases, while the p-channel feedback transistor turns on and conducts more current. The increase current through the p-channel feedback transistor and the decreased current through the n-channel feedback transistor causes the voltage of intermediate node NDN2 to rise slowly as output Y slowly falls.

As output Y passes through the switching voltage and nears ground, the n-channel feedback transistor turns off, allowing the p-channel feedback transistor to pull nodes M and NDN2 high. As node NDN2 rises, the VOL transistor turns on. This causes output Y to fall more quickly to ground. With the VOLO transistor on, a large sink current is provided to maintain a low VOL.

Figure 3:
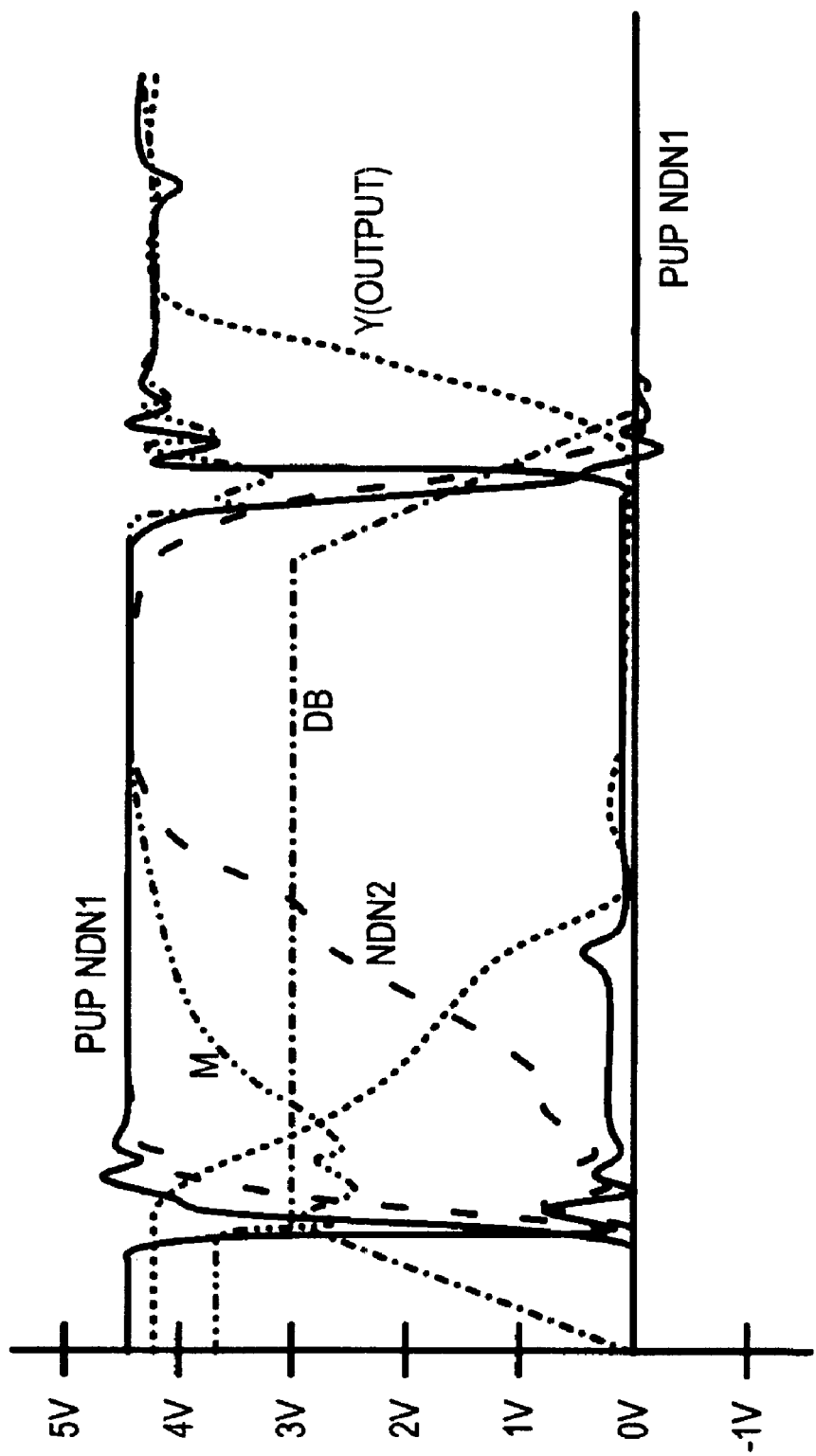
FIG. 3 shows a waveform of the output buffer for both a low-going and a high-going transition.

FIG. 3 shows a waveform of the output buffer for both a low-going and a high-going transition. The gates nodes PUP, NDN1 of the switching transistors follow data-bar signal DB going high and low. Node M is pulled low by about a volt by charge sharing as the p-channel data transistor switches on and off.

Node NDN2 rises slowly, waiting for the feedback transistors to be switched by the slowly rising output Y, but falls quickly as the data transistors switch. Thus the VOL transistor is enabled slowly but quickly disabled. The output Y can thus rise quickly, depending on the size of the p-channel switching transistor chosen by the circuit designer. The rise and fall times of output Y can be matched by an appropriate choice of sizes of the p-channel and n-channel switching transistors.

In one embodiment, resistor 56 is a 6-ohm resistor, and resistor 58 is a 20-ohm resistor. The W in microns of transistors 10, 12, 14, 26 are 760, 160, 400, and 1 7, respectively. This produces AC switching currents of 120 mA, 50 mA, and 25 mA for transistors 10, 12, 14.

ALTERNATE EMBODIMENTS

Several other embodiments are contemplated by the inventor. For example many transistor device sizes can be used. Additional devices such as capacitors can be added, and many parasitic devices are always present. The voltage threshold of output Y that causes VOL transistor 14 to turn on can be adjusted by adjusting the relative sizes of data transistors 24, 26, and to some degree the sizes of transistors 22, 28. For example, VOL transistor 14 can be delayed from turning on by lowering the voltage threshold, such as by increasing the size of n-channel feedback transistor 26 and decreasing the size of p-channel feedback transistor 24. Reducing the size of n-channel data transistor 28 also lowers the switching threshold and delays turn on.

The switching transistors and the VOL transistors can be further divided into smaller transistors that can be gradually turned on and off, further reducing ground bounce. Other ground-bounce-reducing techniques can be combined with the VOL transistor output buffer.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A noise-reduced output buffer comprising:
   a pull-up transistor for sourcing a pull-up current to an output in response to a first gate node;
   a switching pull-down transistor for sinking a switching current from the output in response to a second gate node;
   a voltage-output-low VOL transistor for sinking a VOL current that is larger than the switching current, the VOL transistor controlled by a third gate node;
   a first feedback transistor, having a gate coupled to the output, for sourcing an enabling current to the third gate node when the output is in a low state;
   a second feedback transistor, having a gate coupled to the output, for sinking a disabling current from the third gate node when the output is in a high state;
   a first data transistor, having a gate coupled to a data node, for coupling the enabling current from the first feedback transistor to the third gate node when the data node indicates that the output is to be driven to a low state; and
   a second data transistor, having a gate coupled to the data node, for driving the third gate node low when the data node indicates that the output is not to be driven to the low state;
   wherein the third gate node is driven high to enable the VOL transistor when the data node indicates that the output is to be driven to the low state and the output is in the low state, the VOL transistor sinking the VOL current after the output has reached the low state.

2. The noise-reduced output buffer of claim 1 wherein the pull-up transistor, the first feedback transistor, and the first data transistor are p-channel transistors, while the switching pull-down transistor, the VOL transistor, the second feedback transistor, and the second data transistor are n-channel transistors.

3. The noise-reduced output buffer of claim 2 further comprising:
   a first resistor, coupled between the output and the pull-up transistor, the first resistor for limiting the pull-up current;
   a second resistor, coupled between the output and the switching pull-down transistor, the second resistor for limiting the switching current.

4. The noise-reduced output buffer of claim 3 wherein the low state is a first range of voltages near ground, while the high state is a second range of voltages near a power-supply voltage, the first range being lower than the second range.

5. The noise-reduced output buffer of claim 4 wherein the VOL transistor is enabled when the output is in the first range of voltages but above ground, but the VOL transistor is disabled when the output is in the second range of voltages.

6. The noise-reduced output buffer of claim 5 further comprising:
   an upper transistor, coupled to source an additional current to the first data transistor.

7. The noise-reduced output buffer of claim 6 wherein the upper transistor is an n-channel transistor having a gate coupled to a high voltage when the output is enabled.

8. The noise-reduced output buffer of claim 7 wherein the upper transistor maintains a voltage of a connecting node within the second range of voltages, the connecting node connecting the first feedback transistor, the first data transistor, and the upper transistor.

9. The noise-reduced output buffer of claim 8 further comprising:
   a data input signal that indicates a high or low state for the output;
   an output-enable input signal that indicates when the output is to be driven;
   a first gate that drives the data node to a high state when either the output-enable input signal indicates that the output is not to be driven, or the data input signal indicates that the output is to be driven to the high state;
   a second gate that drives the first gate node to the low state when the output-enable input signal indicates that the output is to be driven, and the data input signal indicates that the output is to be driven to the high state;
   a third gate that drives the second gate node to the high state when the output-enable input signal indicates that the output is to be driven, and the data input signal indicates that the output is to be driven to the low state.

10. The noise-reduced output buffer of claim 9 wherein the first gate is a NAND gate that receives the data input signal and the output-enable input signal, the data input signal being in the low state when the output is to be in the high state, the output-enable input signal being in the high state when the output is to be driven;
    wherein the second gate is an OR gate that receives the data input signal and an inverse of the output-enable input signal, the second gate driving the first gate node;
    wherein the third gate is an inverter that inverts the data node to generate the second gate node.

11. The noise-reduced output buffer of claim 10 wherein the OR gate is a NOR gate and an inverter.

12. An output buffer comprising:
    a pull-up transistor having a gate coupled to a first node, a source coupled to a power supply, and a drain coupled to an output;
    a switching pull-down transistor, having a gate coupled to a second node, a source coupled to a ground, and a drain coupled to the output;

a static pull-down transistor, having a gate coupled to a third node, a source coupled to the ground, and a drain coupled to the output;

a first feedback transistor, having a gate coupled to the output, a source coupled to the power supply, and a drain coupled to an intermediate node;

a first data transistor, having a gate coupled to a first data node, a source coupled to the intermediate node, and a drain coupled to the third node;

a second data transistor, having a gate coupled to the first data node, a source coupled to the ground, and a drain coupled to the third node; and a second feedback transistor, having a gate coupled to the output, a source coupled to the ground, and a drain coupled to the third node;

wherein the static pull-down transistor is enabled after the switching pull-down transistor is enabled and has driven the output below a switching voltage.

13. The output buffer of claim 12 wherein the static pull-down transistor is at least 5 times larger than the switching pull-down transistor.

14. The output buffer of claim 12 wherein the pull-up transistor, the first feedback transistor, and the first data transistor are p-channel transistors, while the switching pull-down transistor, the static pull-down transistor, the second feedback transistor, and the second data transistor are n-channel transistors.

15. The output buffer of claim 12 further comprising:

a first resistor coupled between the output and the source of the pull-up transistor;

a second resistor coupled between the output and the source of the switching pull-down transistor.

16. The output buffer of claim 12 further comprising:

an upper transistor, having a source coupled to the power supply and a drain coupled to the intermediate node, with a gate driven to a power-supply voltage when the output buffer is enabled.

17. The output buffer of claim 16 wherein the upper transistor is an n-channel transistor with a gate coupled to an output-enable signal.

18. The output buffer of claim 12 further comprising:

a NAND gate receiving a data-bar input and the output-enable signal, for outputting the first data node;

a first inverter, receiving the first data node as an input, for driving the second node;

an OR gate, receiving the data-bar input and an inverse of the output-enable signal, for outputting the first node.

19. A low-noise, high-sink-current output buffer comprising:

pull-up transistor means for driving a pull-up current to an output in response to a first node, the pull-up current for raising a voltage of the output;

switching pull-down transistor means for driving a switching current to the output in response to a second node, the switching current for reducing a voltage of the output;

static transistor means for driving a sink current to the output, the sink current for maintaining a low state of the output when an external device forces the sink current into the output, the static transistor means responsive to a third node;

first feedback transistor means for sourcing a current to an intermediate node in response to a gate coupled to the output when the output is below a switching voltage;

first data transistor means for passing the current from the intermediate node to the third node, the first data transistor means responsive to a gate driven low when the output is to be driven low;

second feedback transistor means for driving the third node toward ground in response to a gate coupled to the output, the second feedback transistor means enabled when the output is above the switching voltage;

second data transistor means for driving the third node toward ground in response to a gate driven high when the output is to be driven high;

upper transistor means, coupled to conduct a parallel current to the intermediate node, the parallel current for maintaining a voltage of the intermediate node above the switching voltage.

20. The low-noise, high-sink-current output buffer of claim 19 further comprising:

gating means, receiving an output-enable signal and a data-state signal, for driving the first node low when the output buffer is enabled and the data-state signal indicates that the output is intended to be in a high state above the switching voltage, for driving the second node high when the output buffer is enabled and the data-state signal indicates that the output is intended to be in a low state below the switching voltage, and for driving gates of the first and second data transistor means with a low voltage when the output is intended to be in a low state below the switching voltage.

* * * * *